(12) United States Patent  
Houck

(10) Patent No.: US 7,127,041 B1  
(45) Date of Patent: Oct. 24, 2006

(54) SIMULTANEOUS TRACING OF MULTIPLE PHONE/DATA CABLES

(76) Inventor: Richard H. Houck, 110 9 Jacinto Way, #11, Saticoy, CA (US) 93004

( * ) Notice: Subject to any disclaimer, the term of this patent is extended or adjusted under 35 U.S.C. 154(b) by 416 days.

(21) Appl. No.: 10/359,072

(22) Filed: Feb. 6, 2003

(51) Int. Cl.
  *H04M 1/24* (2006.01)
  *H04M 3/08* (2006.01)
  *H04M 3/22* (2006.01)
  *H01H 31/02* (2006.01)
  *G01R 19/00* (2006.01)

(52) U.S. Cl. .................. 379/25; 379/21; 379/22.07; 324/555; 324/66

(58) Field of Classification Search ............... 379/1.01, 379/12, 18, 19, 21, 22.06, 22.07, 25; 324/512, 324/515, 528, 754, 764, 555, 66; 340/853.2, 340/514, 518, 3.6, 825.36, 825.49
See application file for complete search history.

(56) References Cited

U.S. PATENT DOCUMENTS

| | | | | |
|---|---|---|---|---|
| 3,902,026 | A * | 8/1975 | Rogers et al. | 340/825.36 |
| 3,903,380 | A * | 9/1975 | Schomburg | 324/66 |
| 5,557,651 | A * | 9/1996 | Wissman | 379/22.02 |
| 5,887,051 | A * | 3/1999 | Sullivan et al. | 379/21 |
| 6,233,558 | B1 * | 5/2001 | Whalley | 704/270 |
| 6,798,183 | B1 * | 9/2004 | Bohley et al. | 324/66 |
| 6,879,664 | B1 * | 4/2005 | Stephens | 379/26.01 |
| 2003/0086537 | A1 * | 5/2003 | Schultz | 379/32.05 |
| 2004/0000898 | A1 * | 1/2004 | Pool et al. | 324/66 |

* cited by examiner

*Primary Examiner*—Quoc Tran
(74) *Attorney, Agent, or Firm*—J. E. McTaggart

(57) ABSTRACT

For tracing multi-conductor cable runs from multiple phone/data locations throughout a building or complex to a junction facility where the cables need to be systematically identified and connected to a terminal panel, rapid tracing and identification are accomplished by deploying a large number of special low-cost senders, e.g. a set of forty eight senders, connecting as many senders as required to energize every cable at each location via its standard modular jack. Each sender delivers a unique identification signal, e.g. a spoken number from 1 to 48, energizing a corresponding phone cable and/or data cable. With all of the cables thusly energized simultaneously and distinguishably, a technician working with a proximity probe in the junction facility can rapidly identify and tag and/or connect all the cables in an uninterrupted session, without requiring the usual assistant and intercom link, and with no time wasted probing unenergized cables. For larger systems beyond the tracing capability of the set number of senders, a range switch provides three additional extension ranges with unique identification numbers to preserve a numerical sequence when more than one session is required. As an optional refinement, one or more of the senders may be further equipped to enable wire-mapping of all active conductors in the cables.

6 Claims, 2 Drawing Sheets

SIMULTANEOUS TRACING OF MULTIPLE PHONE/DATA CABLES

FIELD OF THE INVENTION

The present invention relates to the field of communications and more particularly, it relates to a labor-efficient method and apparatus for tracing and identifying, in a junction facility, phone/data cables originating in a large number of different user locations throughout buildings or complexes, while in process of new installation, refurbishment and/or maintenance of communication service.

BACKGROUND OF THE INVENTION

Indoor telecommunication hookup technology has evolved to a standard practice of utilizing cables with six or eight copper wire conductors for use as three or four pairs, where each pair provides one basic phone or data line. The six or eight wires in each cable are distinctively color coded and the active conductors are connected at the user end to corresponding contacts in modular jacks, typically of a six- or eight-position type that can be equipped with up to six or eight contacts respectively.

A simple single "phone line" or "data line" requires only one pair of conductors in the cable and one pair of contacts in a modular jack; however for purposes of easy identification between phone lines and data lines in installation, it has become a standard practice to utilize the six-conductor cable and the six-position modular jacks for phone lines, and to utilize the eight-conductor cable and the eight-position modular jacks for data lines. A small installation with two phone lines and one data line would most likely be implemented with a six-conductor cable for the phone lines, with four conductors connected to two contacts each of two six-position modular jacks, and with an eight-conductor cable for the data line, with two conductors connected to two conductors of an eight-position modular jack. Such a system could be implemented at lower material cost with a single six-conductor cable; however for minimum overall installation cost of labor plus material, the typical tradeoff results in the use of more than the possible minimum number of cables, and many of conductors in the cables may be left unutilized.

In the installation of phone/data lines in larger buildings and complexes, multiple cables are run from numerous user outlets in various rooms and locations to a junction facility or "phone service room" equipped with a terminal panel, known as a "patch panel", where the cables must be identified for interconnection to external communication lines. however this does not provide identification in a large bundle of cable ends, consequently these must be correlated with the various user outlets for systematic connection to the terminal panel.

Such tracing and identification as practiced in known art is highly labor-intensive, inefficient and costly, typically requiring at least two technicians and involving a large amount of repetitious and redundant testing.

DISCUSSION OF KNOWN ART

As performed conventionally, tracing the wiring typically requires a test signal source to be connected sequentially to numerous individual cables or lines at boxes located throughout the building, and concurrently, at the junction facility, interrogating many cables each time until the one energized with the test signal is detected, then tagging and/or connecting the pairs to the terminal panel in an organized manner.

With equipment of known art, the above described task is highly inefficient and virtually unviable for an unassisted technician. Even with two technicians, and with the best of known conventional equipment including a voice communication link, this task of line identification tends to be very slow, tedious and inefficient. One technician must repeatedly relocate the signal generator to the various building locations, while the other technician, working in the junction facility, must communicate repeatedly with the first technician to identify the source locations of the cables, and wastes much time probing many cables redundantly to find the energized one for each new user outlet location under test.

Apparatus of known art has been disclosed for tracing modern copper telecommunications cables with typically as many as 600 pairs; such cable may extend many miles in length, but all the pairs are co-located at each end of the cable, so tracing can be performed with a single signal generating instrument with multiple outputs. Typical amongst patents in that field of endeavor. U.S. Pat. No. 6,233,558 to Whalley, U.S. Pat. No. 3,742,350 to White, U.S. Pat. No. 3,288,944 to Fleming, and U.S. Pat. No. 2,869,077 to Houk all utilize the general principle of tracing lines in multi-conductor cables with some type of individual test signal generator at one end energizing at least one pair of lines under test, and some type of receiver or detector at the other end, at least able to detect a single test signal and in some cases able to distinguish between multiple outputs from a source generator.

Receivers, detectors and listening devices for testing lines are known., e.g. telephone/telecommunications test instruments have been disclosed in U.S. patents e.g. U.S. Pat. No. 5,887,051 to Sullivan et al and U.S. Pat. No. 5,193,108 to Stocklin.

Telephone technicians' test instruments for specialized purposes have been disclosed, e.g. U.S. Pat. No. 5,025,466 to Hilligoss et al and U.S. Pat. No. 4,922,516 to Butler et al.

U.S. Pat. No. 5,557,651 to Wissman discloses a SIGNAL GENERATOR FOR TRACING MULTIPLE TRANSMISSION LINES wherein a sole signal generator is provided with multiple outputs and programmed to provide distinctive time-coded tone signals at each output, for use in tracing multiple lines only from a first location to a second location.

While the foregoing examples of known art have addressed tracing of multiple lines in various fields of endeavor, none have addressed the field of endeavor of the present invention, i.e. efficient tracing of multiple multi-conductor cables that originate in a large number of different locations within a large building or complex that must be identified and correlated in a junction facility at the opposite end of the cable.

OBJECTS OF THE INVENTION

It is a primary object of the present invention to provide an efficient method and apparatus for tracing telephone and data lines originating at a large number of source locations and terminating at a common junction facility where they must be correlated for connection.

It is a further object that the method provided can be performed efficiently by an unassisted technician, thus freeing other personnel for other tasks.

It is a further object to enable testing of up to forty eight different source locations simultaneously, as a practical overall tradeoff between test equipment cost and work efficiency.

SUMMARY OF THE INVENTION

The foregoing objects have been accomplished in the present invention of a system and apparatus for tracing multiple copper cable runs from multiple phone/data locations throughout a building or complex to a junction facility. Fast and efficient multiple cable tracing and identification are accomplished by providing a sufficient quantity of special low-cost senders, e.g. a set of forty eight senders, and deploying as many of these as required for the locations in a particular installation. Each sender delivers a uniquely identifiable signal to a corresponding phone and/or data cable via at least one conductor in a standard modular connector plug. With all of the cables thusly energized simultaneously and identifiably, a technician working in the junction facility can identify and tag and/or connect each cable of the project rapidly and accurately in an uninterrupted session, without requiring assistance from any other technician or intercom link and with no time wasted probing unenergized cables or revisiting the outlet locations. A four-position range switch provides additional extension ranges of each ID number for use as required for additional sessions. As an optional refinement one or more of the senders may be augmented to provide wire-mapping of each conductor in the cables/connectors.

BRIEF DESCRIPTION OF THE DRAWINGS

The above and further objects, features and advantages of the present invention will be more fully understood from the following description taken with the accompanying drawings in which.

DETAILED DESCRIPTION

Figure 1:
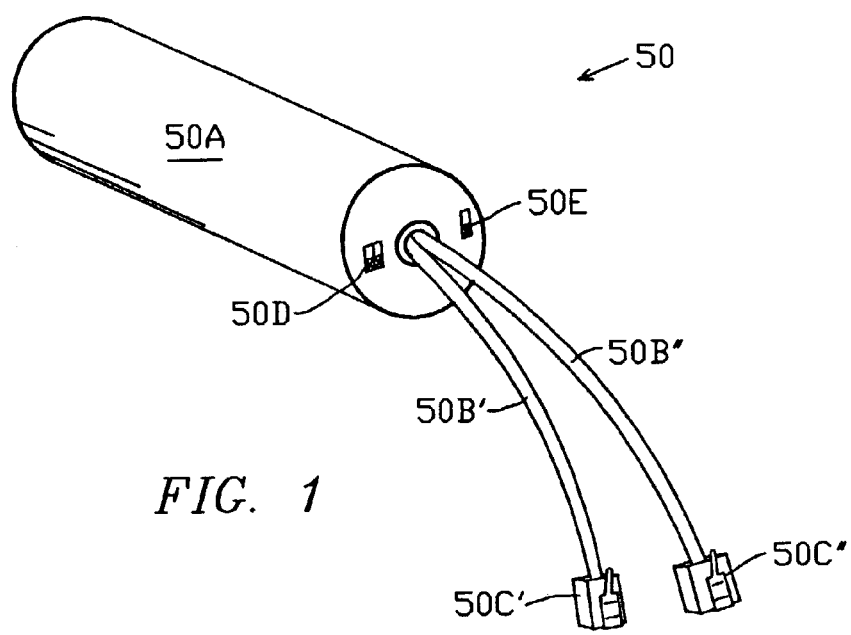
FIG. 1 is a perspective view of a signal sender typical of a multiplicity of such senders that are deployed in phone/data line/cable tracing in accordance with the present invention.

FIG. 1 is a perspective view of an audio test signal sender 50 developed particularly for simplicity and low-cost so that large quantities of such senders can be deployed in simultaneous phone/data cable testing in accordance with the present invention. In a preferred embodiment, a custom set of 48 special senders 50 is provided. Each sender 50 delivers an audio test signal that is uniquely identifiable amongst the set of 48 senders, via two output pairs 50B' and 50B" connected to at least two of the contacts in each of two standard modular connectors: a six-position modular connector 50C' and an eight-position modular connector 50C".

Each sender 50 is provided with a four-position range switch 50 implemented by two spst switches 58D in a "double DIP", i.e. two switches in a dual in-line package providing four range settings (00, 01, 10, 11), and a spst ON/OFF switch 50E controlling power from on-board battery 50H.

To practice the present invention for tracing of phone/data lines/cables from various phone/data cable outlet locations in a building or complex to a junction facility, the quantity of senders required for the outlets, up to the quantity available, typically 48, are deployed simultaneously, connected to energize each cable with an identifying signal at the various phone/data outlet locations throughout the building or complex. Then the signals are sensed at the other end of the cables in the junction facility, where each energized cable can be easily and rapidly identified for proper connection by an unassisted technician in a single session.

Figure 2:
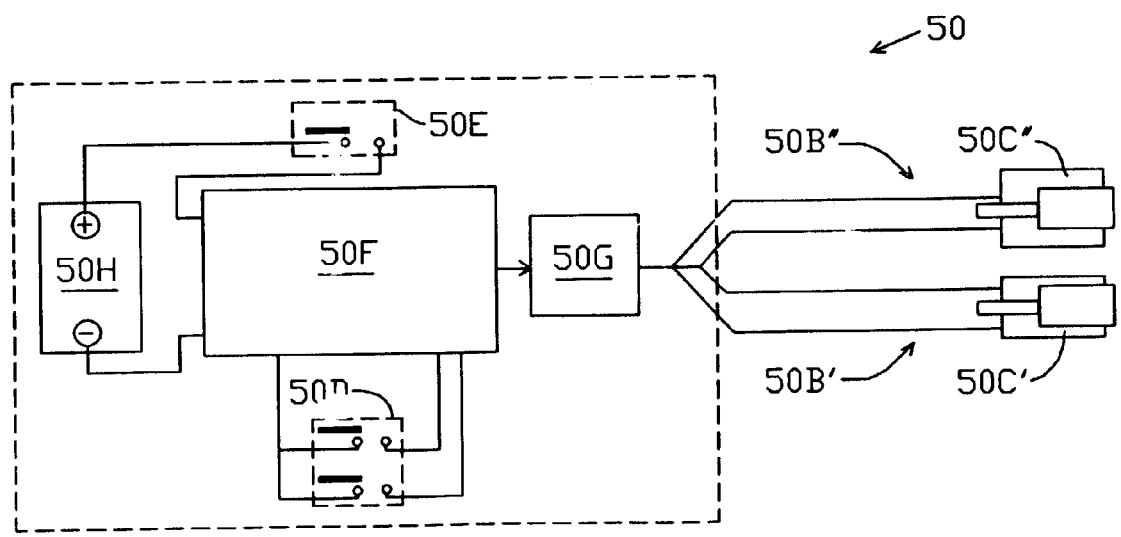
FIG. 2 is a functional block diagram of the signal sender of FIG. 1.

FIG. 2 is a functional block diagram of a typical test signal sender 50 of FIG. 1. A voice simulator microprocessor chip 50F and d/a converter/audio driver 50G are powered from an on-board battery 50H, typically providing 6.4 volts from four AA cells or an equivalent battery providing at least 6 volts.

Chip 50F is programmed expressly for each sender 50 to repeatedly deliver a simulated voice message speaking the one or two numerals of the ID number assigned to that particular sender 50, e.g. in a range of 1 to 48, with range switch 50D set to the primary range. In the three higher ranges selectable by switch 50D, the ID number is incremented by 48 for each range, providing a total of 192 different ID numbers available as follows:

Range 1: 1 to 48
Range 2: 49 to 96
Range 3: 97 to 144
Range 4: 145 to 192

For example, for the particular sender whose ID# is 33 in the primary range, this would be backed up by # 81 (33+48), # 129 (81+48), and # 177 (129+48) in the higher ranges that can be selected by range switch 50D. For large systems that require more than one session of testing, the extra ranges preserve the cable number sequence to avoid confusion at the junction box The d/a converter/driver device 50G receives the digital audio output from chip 50F, converts this to analog and delivers a single-ended output signal to two output cables 50B' and 50B" which are each made about six inches long. One of the output cables 50B' is terminated with a standard 6-position modular plug 50C' while the other output cable 50B" is terminated with a standard 8-position modular plug 50C" In each output cable, two conductors are connected to the two basic contacts in the modular plug, typically #1 and #2 which are the contacts normally utilized for a basic 2-wire phone or data hookup.

The recorded voice message may be simply the number spoken in ordinary English or other language, or for maximum clarity, the number can be spoken with special phonetic radiotelephone pronunciation, and/or it can be spoken alternately in different languages.

Figure 3:
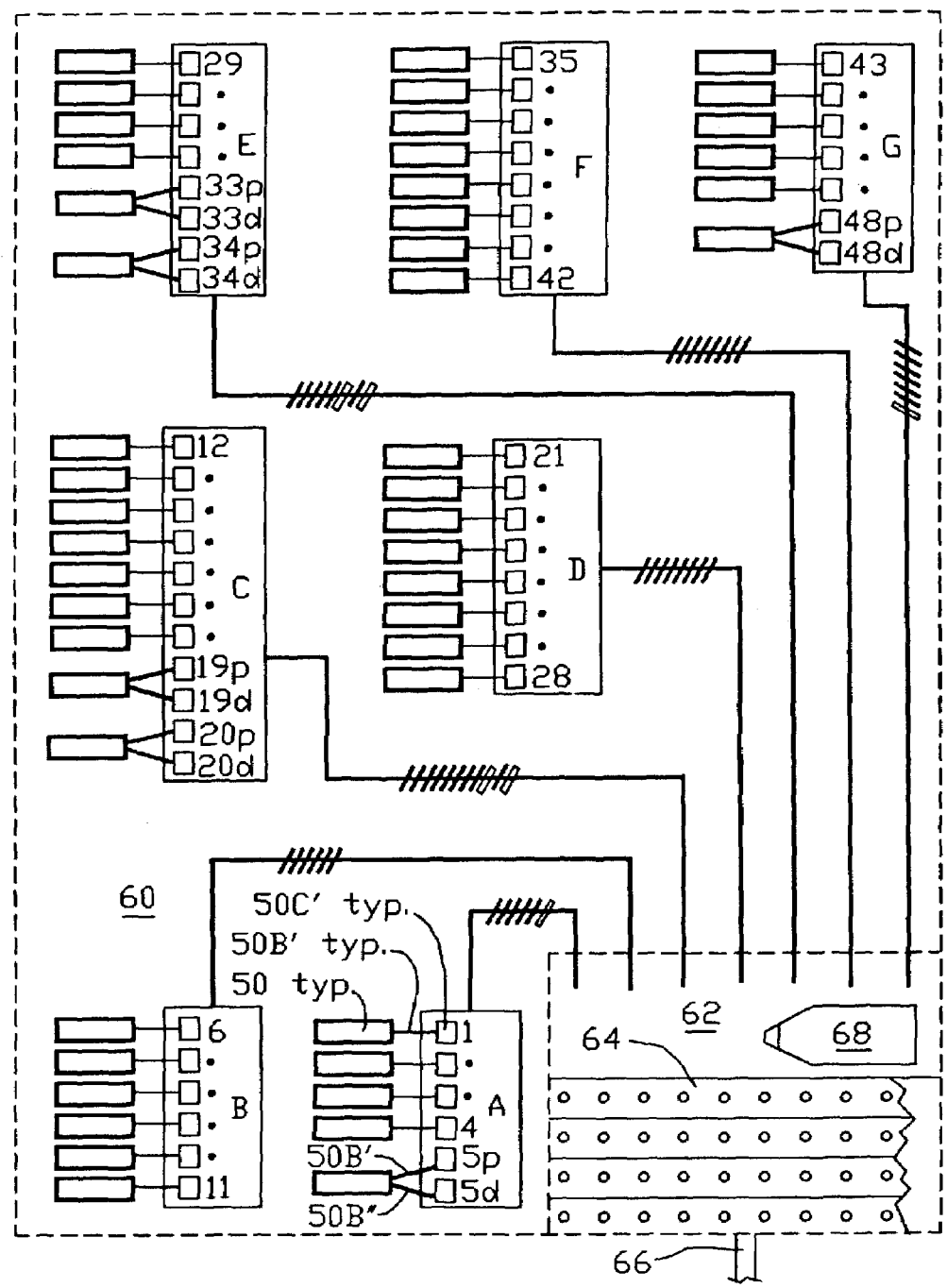
FIG. 3 is a representation of a building or complex with multiple phone/data lines/cables, terminating in a junction facility, in process of being traced simultaneously in accordance with the present invention, by deploying a multiplicity of signal senders as in FIGS. 1 and 2.

FIG. 3 depicts an illustrative example of a phone/data installation project in a building 60, or a complex of buildings, wherein a kit of forty eight senders 50, identified 1 to 48, have been deployed and connected by their modular connectors 50C to fifty four modular jacks 1 to 48, including forty eight phone cables (#1p to #48p) and six data cables (#5d, #19d, #20d, #33d, #34d and #48d), installed in seven different locations A–G, all running to the junction facility 62, a phone service room which is fitted with a terminal panel 64 with an array of junction connecting terminals sometimes referred to as a "patch panel", connected via a trunk cable 66 to the external service provider's system. Typically terminal panel 64 is provided in multiple standard modules of twenty four cables per module.

Each phone/data cable contains typically six or eight color-coded wires, i.e. three or four pairs: for modular connectors normally provided with six or eight contacts to accommodate three or four pairs of wires. A basic single line phone hookup utilizes only two of the contacts, connected to one pair of wires. Cable tracing could be performed with the sender 60 driving only one of the conductors in the cable under test; however it is convenient and more reliable to utilize the standard configuration of a basic telephone hookup, i.e. a two-conductor cable connected to two contacts in the modular plug, and for tracing purposes of this invention, to simply energize both of these conductors with the audio test signal.

The number of cables from each location is indicated by the slanted cross-lines. Phone outlets are normally the standard six-position modular jacks while data outlet are normally the standard eight-position modular jacks. Each sender 50 is equipped with one each of these two sizes of modular plugs as output connectors: in practice either or both can be utilized as required.

Since the eight-conductor data cables are readily distinguishable from the six-conductor phone cables by the technician at the junction facility, one sender can be utilized to drive both a phone cable and a data cable without confusion at the junction facility 62, as indicated in FIG. 3: 5p, 5d; 19p, 19d; 20p, 20d; 33p, 33d; 34p, 34d; 48p, 48d. Thus up to forty eight phone cables (two terminal panel modules) and up to forty eight data cables (i.e. a total of four terminal panel modules) can be traced simultaneously in a single session in the basic range 1 to 48 by an unassisted technician.

Sensing the ends of the cables in the junction facility 62 is performed with a commercially available audio sensing probe 68, such as Model 200EP Inductive Amplifier by Progressive Electronics, Mesa, Ariz. The sensing probe 68 need only to be brought close enough to the cable end under test to pick up a usable signal level by capacitive coupling; it is not necessary to make electrical contact to the wire. The actual cable sensing is basically similar to that of well-known conventional practice. However having all cables energized eliminates the wasted time of conventional cable tracing where the technician has to repeatedly look though a large cluster of unenergized cables to find the one that is energized. Instead, with all cables energized the technician immediately identifies each energized cable in sequence and rapidly tags or attaches it, wasting no time on probing through unenergized cables. This rapid sensing of the cable ends can be even further expedited with an ergonomic probe, e.g., in a glove fingertip, leaving both hands free to tag or make connections.

For larger projects, the higher ranges 2, 3 and 4 are brought into deployment as required; tracing is performed in one session per range thus accommodating as many as three hundred and eighty four cables, all uniquely identified in sequence, in four sessions.

With the cable tracing according to this invention as described above, it is assumed that any required wire-mapping of the individual outlet modular jacks will be performed and informally documented in advance of the cable tracing operation, and that the technician will rely on cable color-coding along with the informal preliminary wire-mapping documentation, As an optional refinement to better organize the task of wire-mapping, some or all of the senders 50 could further configured with additional memory capability, and equipped with six-conductor and eight-conductor output cables fully connected to all contacts in the modular plugs, provision of suitable drivers, and the microchip further programmed in a manner to enable wire-mapping of all the individual contacts in each modular outlet to supplement the tracing operation. The microprocessor would be provided with capability of wire-mapping data entry and retrieval and management of the test signals for rapid identification of each wire or pair at the junction facility, in addition to ID at the cable level. This would have the advantage of "computerizing" the task of wire-mapping for greater speed and accuracy.

As a further option, for working with outlet locations that have large quantities of outlets, one or more multi-master senders could be provided with numerous simultaneous outputs with different ID, each providing a corresponding output to the pair of modular plugs (six/eight-position) for deployment with multiple installed phone/data outlets that are at the same location.

The use of voice simulation for identification is believed to be a cost effective coding/decoding option since human aural recognition avoids the cost and complexity of automated decoding apparatus. However the concept of multiple simultaneous cable tracing in accordance with the present invention could also be practiced utilizing alternative identification coding systems such as selective tone frequencies, time coded groups, Morse code and the like, and other forms of recognition/identification including semi or fully automated approaches could be substituted for the audible voice recognition described herewith.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. An audio frequency cable-tracing system for tracing telephone and data cables originating from a plurality of service outlet locations and running to a junction facility where, at installation, the cables need to be identified and connected to a telecommunication service provider's terminal panel, the cable-tracing system comprising;

a set of senders in a designated quantity in a range from 16 to 48, each sender being made and arranged to generate an audio voice signal, originated by a voice synthesizer microchip, that includes a unique sender identification number repeated at designated time intervals, each sender delivering the associated audio signal for connection to at least one conductor at a first end of a multi-conductor cable at a service outlet location, so as to enable identification of the sender at a second and opposite end of the cable amongst a bundle of similar cables;

an audio frequency sensing device made and arranged to sense the audio signal present in a cable when placed in close proximity to the second end of the cable in the junction facility so as to enable detection of the identification number by a technician, such that, amongst a plurality of cables in the bundle of simultaneously energized by the corresponding senders, the technician is enabled to sequentially identify each cable for purposes of connecting the cable correctly to the telecommunication service provider's terminal panel; and a user-operable four-position range switch made and arranged to make three additional unique identification numbers available in increments of the designated quantity of said set of senders added to the sender's basic unique identification number, selectable by the range switch to constitute the audio signal voice message.

2. The audio frequency cable-tracing system as defined in claim 1 further comprising in each sender:
- a standard eight-position modular plug having at least one position equipped with a contact;
- a first flexible output cable extending from a main body of the sender and terminated by the eight-position modular plug, made and arranged to connect the audio driver to at least one contact in the eight-position modular plug;
- a standard six-position modular plug having at least one of the positions equipped with a contact; and
- a second flexible output cable extending from the main body alongside the first flexible output cable and terminated by the six-position modular plug, connecting the audio driver to a least one contact in the six-position modular plug.

3. The audio frequency cable-tracing system as defined in claim 2 wherein:
- each sender comprises a total of eight uniquely identifiable audio signal sources:
- the eight-position modular plug is equipped with eight contacts;
- the first output cable contains eight conductors connecting each of the eight audio signal to a corresponding contact in the eight-position modular plug; and
- the second output cable contains six conductors connecting six of the eight audio signals to six corresponding contacts in the six-position modular plug.

4. The audio frequency cable-tracing system as defined in claim 1 wherein the designated quantity of said set of senders is made to be 48, numbered for identification from 1 to 48.

5. A method for tracing telephone and data cables originating from a plurality of corresponding service outlet locations and extending to a junction facility where the cables need to be identified and connected to a service providers terminal panel, particularly for large systems with a quantity of cables to be traced that exceeds capabilities of a set quantity of senders to trace in a single session, and wherein each sender is provided with a user-operable multi-position range switch made and arranged to make available a plurality of additional unique identification numbers each being calculated as the senders basic unique identification number plus an integral multiple of the set quantity, the multiple being selectable by the range switch which, as default condition, is initially set to a basic range, comprising the steps of:

(a) providing a set quantity of individual separate audio frequency senders each with a uniquely-identifiable signal to independently energize each of the cables simultaneously;

(b) connecting each sender to and thus energizing at least one line of each corresponding one of the cables at a service outlet location;

(c) probing the cables sequentially at an end thereof in the junction facility in a manner to identify each cable with the corresponding service outlet; and, for each cable when identified;

(d) connecting each conductor of the identified cable to an appropriate terminal of the terminal panel:

(e) switching the range switch of each sender to a next higher range, and (f) repeating steps (b) through (e) until all cables to be traced have been traced.

6. The method for tracing telephone and data cables as defined in claim 5 further comprising, between step (c) and step (d) the further substeps of:

(c1) annotating the identification on a tag when a cable is identified; and (c2) attaching the tag to the identified cable.

* * * * *